United States Patent
Lin et al.

(10) Patent No.: US 9,418,876 B2
(45) Date of Patent: Aug. 16, 2016

(54) METHOD OF THREE DIMENSIONAL INTEGRATED CIRCUIT ASSEMBLY

(75) Inventors: Jing-Cheng Lin, Hsin-Chu (TW); Weng-Jin Wu, Hsin-Chu (TW); Shih Ting Lin, Taipei (TW); Cheng-Lin Huang, Hsin-Chu (TW); Szu Wei Lu, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 638 days.

(21) Appl. No.: 13/224,575

(22) Filed: Sep. 2, 2011

(65) Prior Publication Data

US 2013/0056865 A1    Mar. 7, 2013

(51) Int. Cl.
*H01L 21/00* (2006.01)
*H01L 21/56* (2006.01)
*H01L 21/683* (2006.01)
*H01L 25/065* (2006.01)
*H01L 23/00* (2006.01)

(52) U.S. Cl.
CPC ............ *H01L 21/568* (2013.01); *H01L 21/561* (2013.01); *H01L 21/6835* (2013.01); *H01L 25/0652* (2013.01); *H01L 21/563* (2013.01); *H01L 21/6836* (2013.01); *H01L 24/16* (2013.01); *H01L 2221/68327* (2013.01); *H01L 2224/16235* (2013.01); *H01L 2224/73204* (2013.01); *H01L 2224/81005* (2013.01); *H01L 2224/81193* (2013.01); *H01L 2224/97* (2013.01); *H01L 2225/06513* (2013.01); *H01L 2225/06517* (2013.01); *H01L 2225/06541* (2013.01)

(58) Field of Classification Search
CPC ............ H01L 25/0652; H01L 21/561; H01L 21/6835; H01L 21/568; H01L 2224/97; H01L 24/16; H01L 2224/81005; H01L 2224/81193; H01L 2225/06513; H01L 2225/06541; H01L 2225/06517; H01L 21/6836; H01L 2221/68327; H01L 2224/16235; H01L 2224/73204
USPC .................. 438/108–113; 257/737, E21.599, 257/E23.068
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |

(Continued)

*Primary Examiner* — Charles Garber
*Assistant Examiner* — Abdulfattah Mustapha
(74) *Attorney, Agent, or Firm* — Slater Matsil, LLP (57) ABSTRACT

A method of fabricating a three-dimensional integrated circuit comprises attaching a wafer to a carrier, mounting a plurality of semiconductor dies on top of the wafer to form a wafer stack. The method further comprises forming a molding compound layer on top of the wafer, attaching the wafer stack to a tape frame and dicing the wafer stack to separate the wafer stack into a plurality of individual packages.

21 Claims, 6 Drawing Sheets

(56) References Cited

U.S. PATENT DOCUMENTS

| | | |
|---|---|---|
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,074,703 B2 | 7/2006 | Fukazawa |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,291,929 B2 | 11/2007 | Tanaka et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,390,700 B2 | 6/2008 | Gerber et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,531,905 B2 | 5/2009 | Ishino et al. |
| 7,537,959 B2 | 5/2009 | Lee et al. |
| 7,557,597 B2 | 7/2009 | Anderson et al. |
| 7,576,435 B2 | 8/2009 | Chao |
| 7,589,406 B2 | 9/2009 | Wood |
| 7,598,617 B2 | 10/2009 | Lee et al. |
| 7,598,618 B2 | 10/2009 | Shiraishi |
| 7,655,504 B2 | 2/2010 | Mashino |
| 7,824,960 B2 | 11/2010 | Hao et al. |
| 7,834,450 B2 | 11/2010 | Kang |
| 7,867,821 B1 | 1/2011 | Chin |
| 7,884,459 B2 | 2/2011 | Yoshida et al. |
| 7,902,638 B2 | 3/2011 | Do et al. |
| 7,948,095 B2 | 5/2011 | Ng et al. |
| 8,101,460 B2 | 1/2012 | Pagaila et al. |
| 8,110,910 B2 | 2/2012 | Kim |
| 8,138,017 B2 | 3/2012 | Chin |
| 8,143,719 B2 | 3/2012 | Toh et al. |
| 8,446,000 B2 | 5/2013 | Shen et al. |
| 8,803,332 B2 | 8/2014 | Lee et al. |
| 2002/0074637 A1* | 6/2002 | McFarland .................. 257/686 |
| 2005/0051883 A1 | 3/2005 | Fukazawa |
| 2005/0167812 A1 | 8/2005 | Yoshida et al. |
| 2005/0230804 A1 | 10/2005 | Tanida et al. |
| 2005/0263869 A1 | 12/2005 | Tanaka et al. |
| 2006/0073701 A1 | 4/2006 | Koizumi et al. |
| 2006/0261491 A1 | 11/2006 | Soeta et al. |
| 2006/0289992 A1 | 12/2006 | Wood |
| 2007/0007639 A1 | 1/2007 | Fukazawa |
| 2007/0090517 A1 | 4/2007 | Moon et al. |
| 2007/0126085 A1 | 6/2007 | Kawano et al. |
| 2007/0138657 A1* | 6/2007 | Condorelli .......... H01L 23/5383 257/787 |
| 2007/0200216 A1 | 8/2007 | Kim et al. |
| 2007/0210447 A1 | 9/2007 | Kinsley |
| 2007/0287265 A1 | 12/2007 | Hatano et al. |
| 2008/0030682 A1 | 2/2008 | Teige et al. |
| 2008/0237310 A1 | 10/2008 | Periaman et al. |
| 2008/0242052 A1* | 10/2008 | Feng et al. .................. 438/459 |
| 2008/0272464 A1 | 11/2008 | Do et al. |
| 2008/0272486 A1 | 11/2008 | Wang et al. |
| 2008/0272504 A1 | 11/2008 | Do et al. |
| 2009/0108440 A1* | 4/2009 | Meyer .................. H01L 21/561 257/723 |
| 2009/0200662 A1 | 8/2009 | Ng et al. |
| 2009/0218671 A1 | 9/2009 | Kuwabara |
| 2009/0258459 A1 | 10/2009 | Gerber et al. |
| 2009/0302435 A1 | 12/2009 | Pagaila et al. |
| 2009/0321948 A1 | 12/2009 | Wang et al. |
| 2010/0013081 A1 | 1/2010 | Toh et al. |
| 2010/0109169 A1 | 5/2010 | Kolan et al. |
| 2010/0159643 A1* | 6/2010 | Takahashi et al. ........... 438/108 |
| 2010/0320587 A1 | 12/2010 | Lee et al. |
| 2010/0327465 A1 | 12/2010 | Shen et al. |
| 2011/0024888 A1 | 2/2011 | Pagaila et al. |

\* cited by examiner

METHOD OF THREE DIMENSIONAL INTEGRATED CIRCUIT ASSEMBLY

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, multi-chip wafer level package based semiconductor devices have emerged as an effective alternative to further reduce the physical size of a semiconductor chip. In a wafer level package based semiconductor device, active circuits such as logic, memory, processor circuits and the like are fabricated on different wafers and each wafer die is stacked on top of another wafer die using pick-and-place techniques. Much higher density can be achieved by employing multi-chip semiconductor devices. Furthermore, multi-chip semiconductor devices can achieve smaller form factors, cost-effectiveness, increased performance and lower power consumption.

A three-dimensional (3D) integrated circuit (IC) may comprise a top active circuit layer, a bottom active circuit layer and a plurality of inter-layers. In a 3D IC, two dies may be bonded together through a plurality of micro bumps and electrically coupled to each other through a plurality of through-silicon vias. The micro bumps and through-silicon vias provide an electrical interconnection in the vertical axis of the 3D IC. As a result, the signal paths between two semiconductor dies are shorter than those in a traditional 3D IC in which different dies are bonded together using interconnection technologies such as wire bonding based chip stacking packages. A 3D IC may comprise a variety of semiconductor dies stacked together. The multiple semiconductor dies are packaged before the wafer has been diced. The wafer level package technology has some advantages. One advantageous feature of packaging multiple semiconductor dies at the wafer level is multi-chip wafer level package techniques may reduce fabrication costs. Another advantageous feature of wafer level package based multi-chip semiconductor devices is that parasitic losses are reduced by employing micro bumps and through-silicon vias.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a method for three-dimensional (3D) integrated circuit (IC) assembly. The disclosure may also be applied, however, to a variety of integrated circuits.

Figure 1:
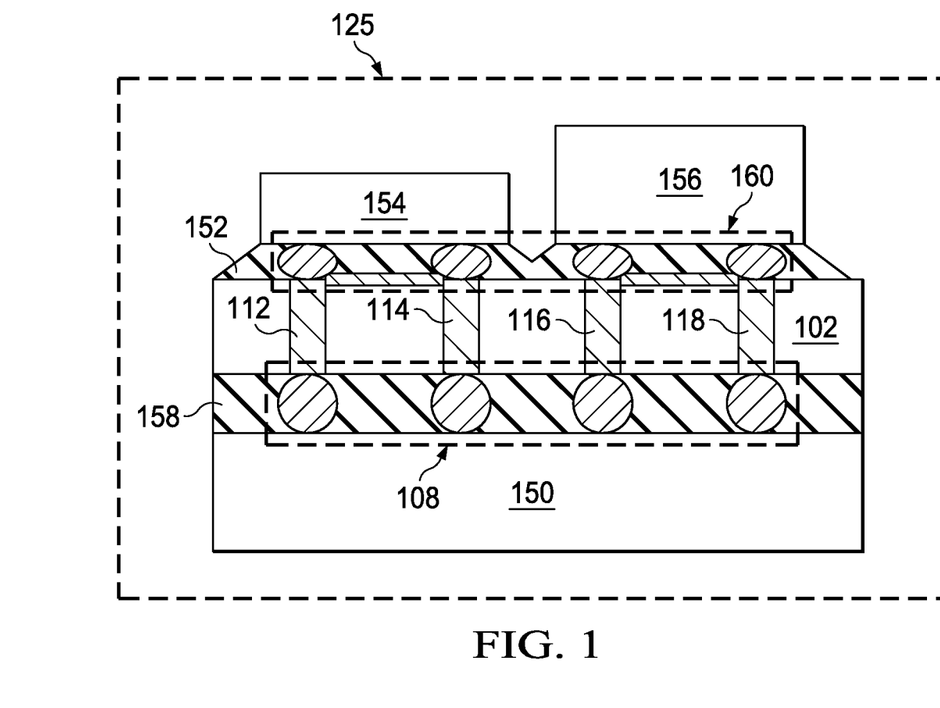
FIG. 1 illustrates a cross sectional view of a three-dimensional (3D) integrated circuit (IC) in accordance with an embodiment.

Referring initially to FIG. 1, a cross sectional view of a 3D IC is illustrated in accordance with an embodiment. The 3D IC 125 comprises a substrate layer 150, a first semiconductor die 102, a second semiconductor die 154 and a third semiconductor die 156. As shown in FIG. 1, the substrate layer 150, the first semiconductor die 102 are stacked together. In accordance with an embodiment, the first semiconductor die may be an interposer. Furthermore, the second semiconductor die 154 and the third semiconductor die 156 are mounted on top of the first semiconductor die 102 to form a wafer stack.

The second semiconductor die 102 may further comprise a plurality of through vias, through-silicon vias or through-substrate vias, namely TSVs 112, 114, 116 and 118. Within the second semiconductor die 102, various active circuits (not shown) are connected to the TSVs such as TSV 112 first, and then further connected to the second semiconductor die 154 and the third semiconductor die 156 through micro bumps 160 formed on one side of the first semiconductor die 102. On the other side of the first semiconductor die 102, there may be a plurality of flip chip bumps 108, a plurality of redistribution layer and passivation layers. It should be noted that the flip chip bumps are commonly known as C4 bumps, and hence are alternatively referred to as C4 bumps hereinafter. By employing the flip chip bumps 108, the first semiconductor die 102 may be further coupled to the substrate layer 150. In sum, active circuits in different layers of the 3D IC 125 can be interconnected through a network formed by TSVs and various bumps.

An underfill material 158 may be formed in the gap between the substrate layer 150 and the first semiconductor die 102. Likewise, another underfill material 152 may be formed in the gap between the second semiconductor 154, third semiconductor 156 and the first semiconductor die 102. In accordance with an embodiment, both the underfill material 158 and the underfill material 152 may be an epoxy. During the fabrication process of the 3D IC 125, for example, the underfill material 158 may be dispensed at the gap between the substrate layer 150 and the first semiconductor die 102. The epoxy may be applied in a liquid form, and may harden after a curing process. An advantageous feature of having the underfill material 158 is that the underfill material may help to reduce the mechanical and thermal stresses during the fabrication process of the 3D IC 125. Furthermore, the underfill material 158 can protect the 3D IC 125 from the external environment.

Figure 2:
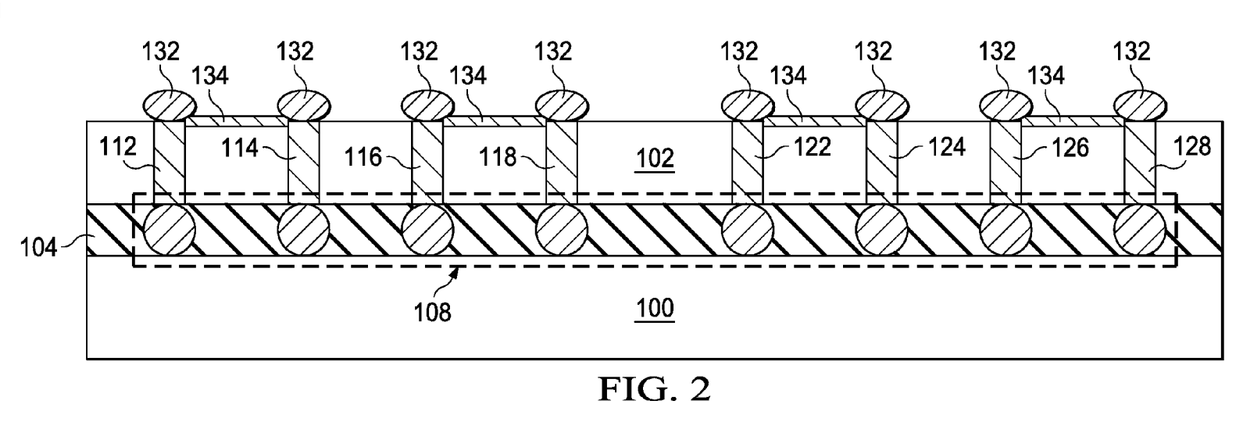
FIGS. 2-6 are cross sectional views of intermediate stages in the making of a 3D IC in accordance with an embodiment.

FIGS. 2-6 are cross sectional views of intermediate stages in the making of a 3D IC in accordance with an embodiment. FIG. 2 illustrates a cross sectional view of placing a first semiconductor die 102 on a carrier 100. As shown in FIG. 2, the C4 bumps side of the first semiconductor die 102 is mounted on the carrier 100. The first semiconductor die 102 may comprise basic semiconductor layers such as active circuit layers, substrate layers, inter-layer dielectric (ILD) layers and inter-metal dielectric (IMD) layers (not shown). The first semiconductor die 102 may further comprise a plurality of micro bumps 132 whose connections are redistributed through a redistribution layer 134. The first semiconductor die 102 may further comprise a plurality of TSVs, such as TSVs 112, 114, 116, 118, 122, 124, 126 and 128. The active circuit layers (not shown) of the first semiconductor die 102 may be coupled to C4 bumps 108 and micro bumps 132 through the plurality of TSVs.

In accordance with an embodiment, the first semiconductor die 102 may be a thin wafer having a thickness of approximately 100 um. In order to reduce the mechanical and thermal stresses during the fabrication process of a 3D IC, a carrier 100 may be employed to prevent the thin wafer (e.g., first semiconductor die 102) from cracking, warping, breaking and the like. In accordance with an embodiment, the carrier 100 may be a standard wafer. By bonding a thin wafer such as the first semiconductor die 102 on top of a standard wafer such as the carrier 100, the bonded device including a thin wafer and a standard wafer can be processed using standard wafer techniques. Furthermore, an underfill material 104 may be formed in the gap between the carrier 100 and the first semiconductor die 102. In accordance with an embodiment, the underfill material 104 may be an epoxy, which is dispensed at the gap between the carrier 100 and the first semiconductor die 102. The epoxy may be applied in a liquid form, and may harden after a curing process.

Figure 3:
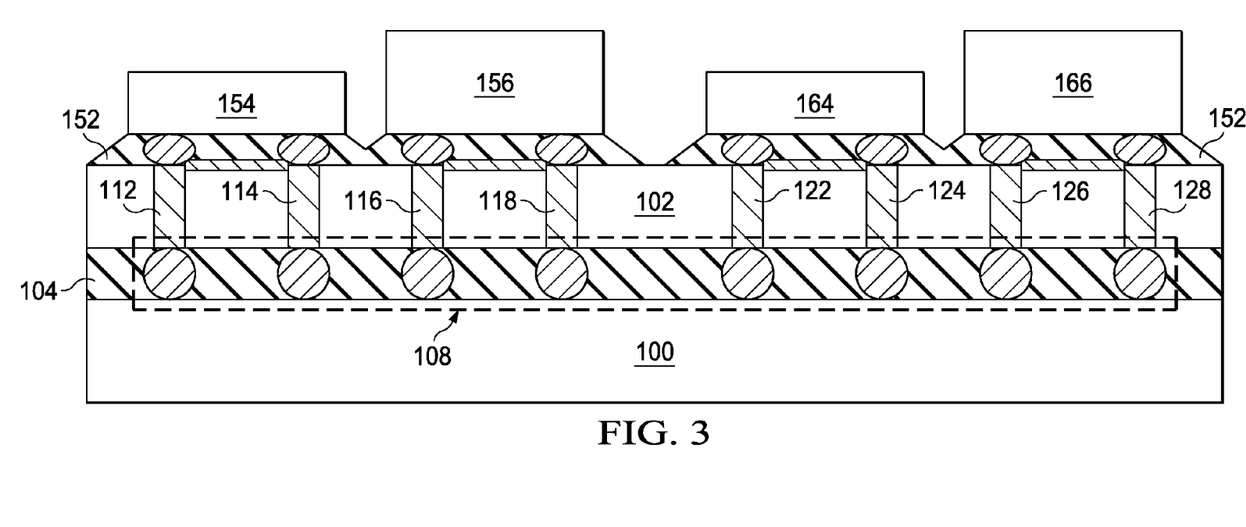

FIG. 3 illustrates the process of stacking a variety of semiconductor chips on top of the first semiconductor die 102. As shown in FIG. 3, a second semiconductor die 154, a third semiconductor die 156, a fourth semiconductor die 164 and a fifth semiconductor die 166 mounted on top of the second semiconductor die 102 and electrically coupled through a plurality of micro bumps placed between the first semiconductor die 102 and the variety of semiconductor chips. It should be noted that while FIG. 3 illustrates four semiconductor dies mounted on the first semiconductor die 102, the first semiconductor die 102 may accommodate any number of semiconductor dies.

The gap between the variety of semiconductor dies such as the second semiconductor die 154 and the first semiconductor die 102 is filled by an underfill material 152. In accordance with an embodiment, the underfill material 152 may be epoxy, polymer and/or the like. During the fabrication process of the wafer stack, for example, an epoxy may be dispensed at the gap between the second semiconductor die 154 and the first semiconductor die 102. The epoxy may be applied in a liquid form, and may harden after a curing process. An advantageous feature of having the underfill material 152 is that the underfill material may help to reduce the mechanical and thermal stresses during the fabrication process of the 3D IC device. Furthermore, the wafer stack shown in FIG. 3 and the underfill material 152 help to prevent the micro bumps from cracking.

Figure 4:
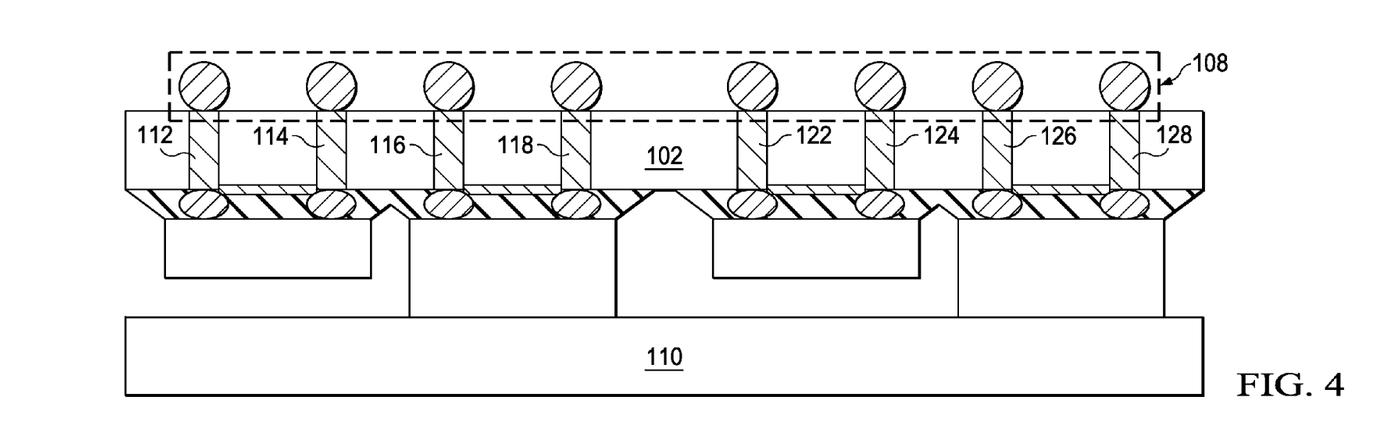

FIG. 4 illustrates a process of attaching the wafer stack to a tape frame. First, a tape frame 110 is laminated on the wafer stack. Subsequently, the wafer stack is removed from the carrier 100. Attaching a wafer stack to a tape frame is well known in the art, and hence is not discussed in further detail herein.

Figure 5:
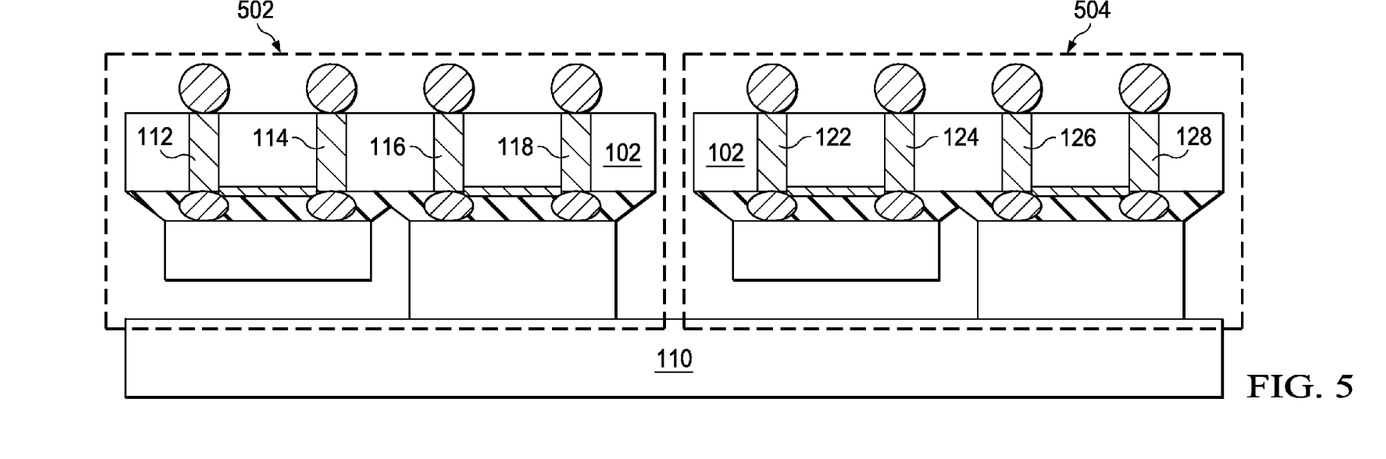

FIG. 5 illustrates a process of separating the wafer stack into a plurality of individual packages using a dicing process. As shown in FIG. 5, a plurality of individual packages such as a first package 502 and a second package 504 are formed by sawing the wafer stack into individual packages. The dicing process is well known in the art, and hence is not discussed in detail herein.

Figure 6:
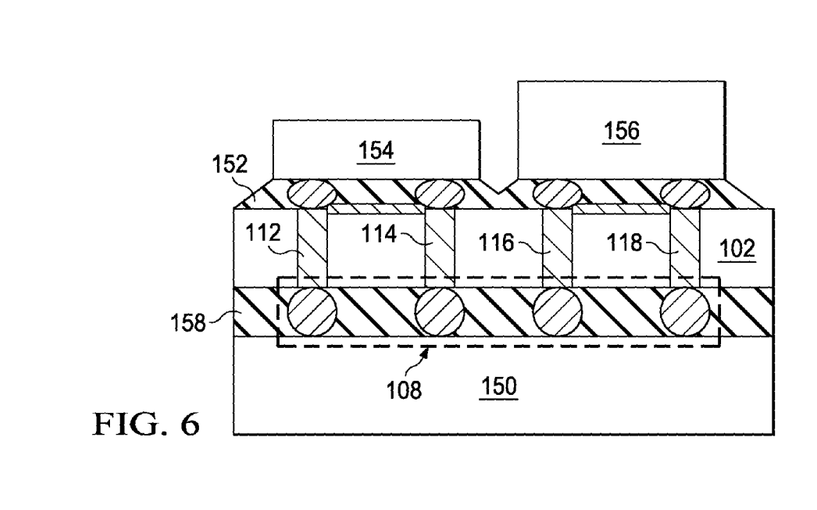

FIG. 6 illustrates a cross sectional view of the 3D IC after the dicing process. As shown in FIG. 6, the packages 502 and 504 have been removed from the tape frame 100 by a pick-and-place process. Both the first package 502 and the second 504 are flipped again. Subsequently, the individual packages such as the first package 502 are mounted on a substrate 150 to form a 3D IC package. Furthermore, in order to reduce mechanical and thermal stresses, an underfill material 158 is formed in the gap between the first semiconductor die 102 and the substrate 150.

Figure 7:
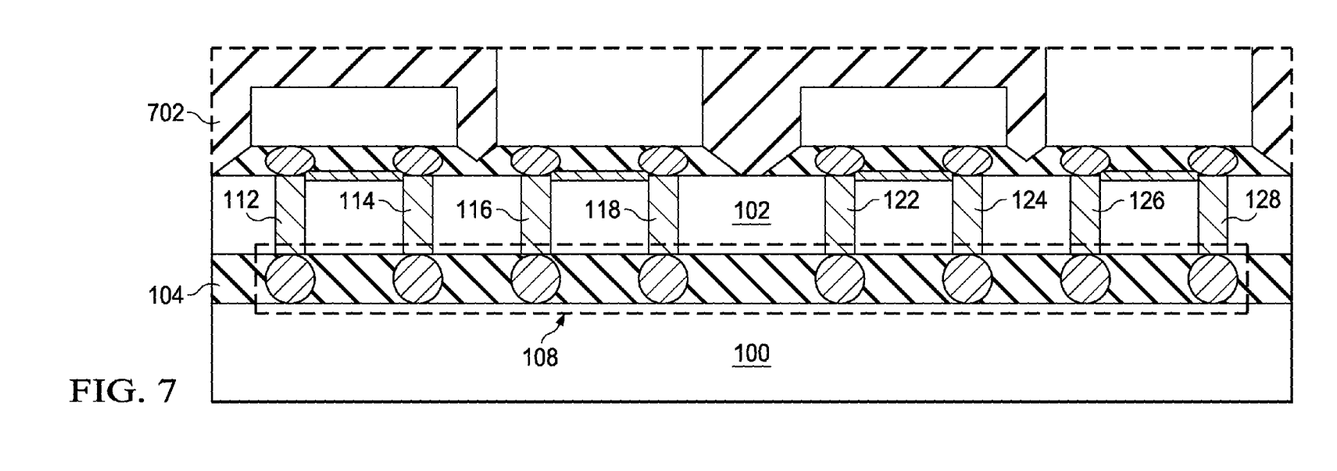
FIGS. 7-10 are cross sectional views of intermediate stages in the making of a 3D IC in accordance with another embodiment.

FIGS. 7-10 are cross sectional views of intermediate stages in the making of a 3D IC in accordance with another embodiment. FIG. 7 illustrates a cross sectional view of a 3D IC structure, which is similar to that shown in FIG. 3 except that a molding compound layer 702 are formed on top of the first semiconductor die 102. As shown in FIG. 7, the second semiconductor die 154, the third semiconductor die 156, the fourth semiconductor die 164 and the fifth semiconductor die 166 are embedded in the molding compound layer 702. The semiconductor dies shown in FIG. 7 such as the first semiconductor die 102 may be a thin wafer having a thickness of approximately 100 um. In order to reliably handle the thin wafer during process steps such as dicing the wafer into separate chip packages, the molding compound layer 702 is employed to keep the thin wafer from cracking, bending, warping and/or the like.

Figure 8:
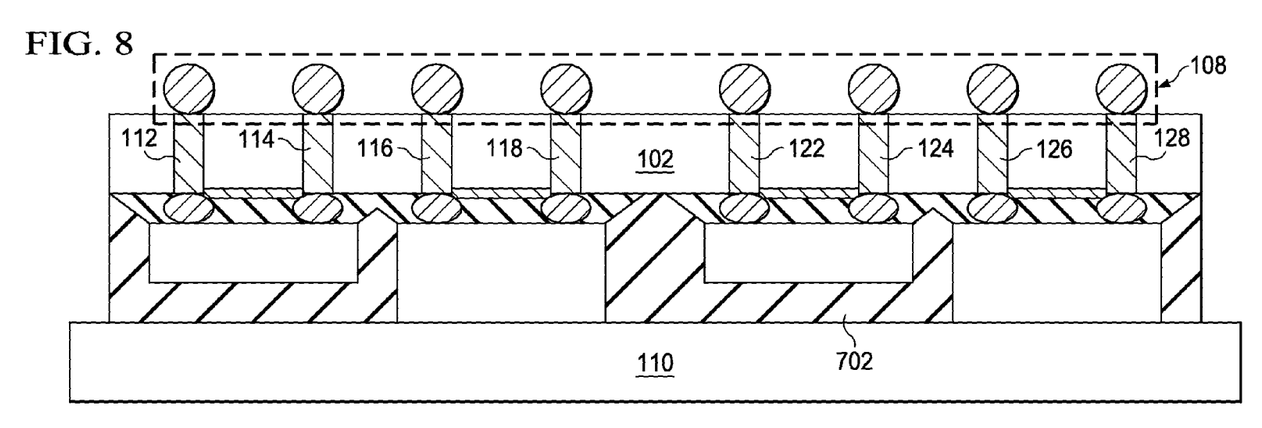
Figure 9:
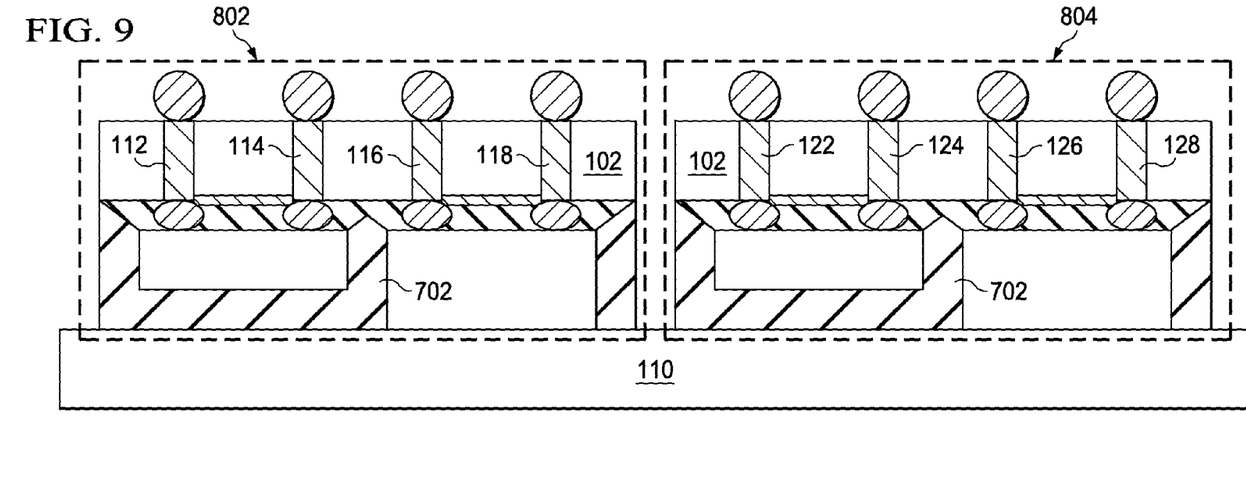
Figure 10:
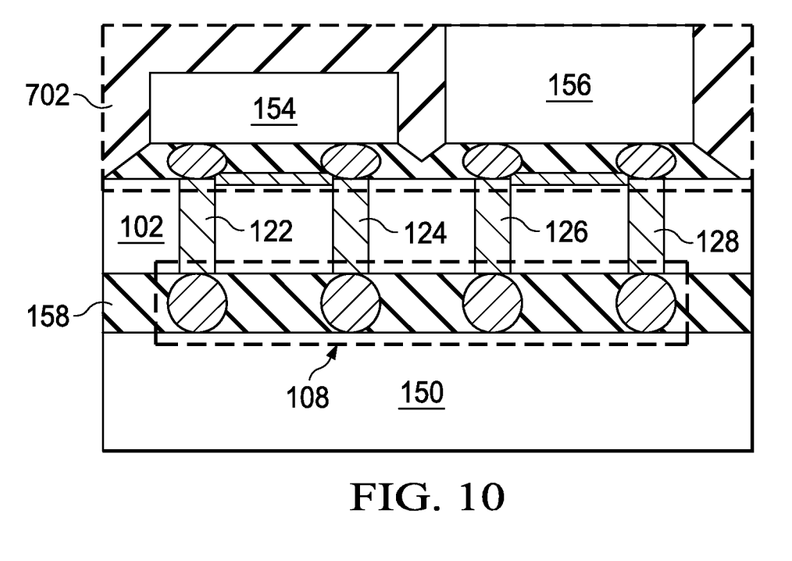

FIGS. 8-10 are similar to FIGS. 4-6 except that the molding compound layer 702 is formed on top of the first semiconductor die 102. The process of attaching the 3D IC to a tape frame, de-bonding the 3D IC from the carrier and sawing the 3D IC into a plurality of individual packages has been described with respect to FIGS. 4-6, and hence is not discuss again to avoid repetition.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A method comprising:
attaching a first side of a wafer to a carrier;
mounting a plurality of semiconductor dies on top of a second side of the wafer to form a wafer stack, the first side being opposite of the second side, wherein a height of a first semiconductor die is equal to a height of a second semiconductor die and the height of the first semiconductor die is greater than a height of a third semiconductor die, and wherein the first semiconductor die, the second semiconductor die and the third semiconductor die are directly attached to the second side of the wafer;

attaching top surfaces of the first semiconductor die and the second semiconductor die to a tape frame, wherein there is a gap between a top surface of the third semiconductor die and the tape frame; and dicing the wafer stack to separate the wafer stack into a plurality of individual packages.

2. The method of claim 1, further comprising:
forming a first underfill layer between the wafer and the carrier.

3. The method of claim 1, further comprising:
forming a second underfill layer between the wafer and the plurality of semiconductor dies.

4. The method of claim 1, further comprising:
de-bonding the wafer stack from the carrier.

5. The method of claim 1, further comprising:
detaching each individual package from the tape frame; and
attaching the individual package on a substrate layer.

6. The method of claim 5, further comprising:
detaching each individual package from the tape frame using a pick-and-place process.

7. The method of claim 1, further comprising:
forming a plurality of first bumps on a first side of the wafer; and
forming a plurality of second bumps on a second side the wafer.

8. A method comprising:
attaching a first side of a wafer to a carrier;
mounting a plurality of semiconductor dies on top of a second side of the wafer to form a wafer stack, the first side being opposite of the second side, wherein a height of a first semiconductor die is equal to a height of a second semiconductor die and the height of the first semiconductor die is greater than a height of a third semiconductor die;
encapsulating the second side of the wafer stack with a molding compound layer;
before de-bonding the carrier from the wafer stack, attaching top surfaces of the semiconductor dies to a tape frame; and
sawing the wafer stack into a plurality of individual packages.

9. The method of claim 8, further comprising:
embedding the plurality of semiconductor dies into the molding compound layer.

10. The method of claim 8, further comprising:
forming a plurality of first bumps on a first side of the wafer;
forming a plurality of second bumps on a second side of the wafer; and
forming a redistribution layer on the second side of the wafer.

11. The method of claim 8, further comprising:
forming a first underfill layer between the wafer and the carrier; and
forming a second underfill layer between the wafer and the plurality of semiconductor dies.

12. The method of claim 8, further comprising:
detaching each individual package from the tape frame using a pick-and-place process; and
attaching the individual package on a substrate.

13. The method of claim 8, further comprising:
forming a plurality of through-silicon vias in the wafer.

14. A method comprising:
attaching a first side of a wafer to a carrier;
mounting a first semiconductor die and a second semiconductor die on a second side of the wafer, the second side being opposite of the first side, the first semiconductor die being laterally adjacent the second semiconductor die;
forming a molding compound along sidewalls of the first semiconductor die and the second semiconductor die, a top surface of the molding compound being above a top surface of the second semiconductor die; and
attaching the top surface of the first semiconductor die and the top surface of the molding compound to a tape frame, the top surface of the first semiconductor die physically contacting the tape frame.

15. The method of claim 14, further comprising dicing the wafer into a plurality of individual packages.

16. The method of claim 15, further comprising:
detaching at least one individual package of the plurality of individual packages from the tape frame; and
mounting the at least one individual package on a substrate.

17. The method of claim 14, further comprising de-bonding the wafer from the carrier.

18. The method of claim 14, further comprising:
forming a plurality of first bumps on the first side of the wafer; and
forming a plurality of second bumps on the second side the wafer.

19. The method of claim 18, further comprising:
forming a first underfill layer on the first side of the wafer, the first underfill layer encapsulating the plurality of first bumps; and
forming a second underfill layer on the second side of the wafer, the second underfill layer encapsulating the plurality of second bumps.

20. The method of claim 14, further comprising forming a redistribution layer on the second side of the wafer.

21. The method of claim 14, further comprising forming a plurality of through vias in the wafer.

* * * * *